United States Patent [19]

Taylor et al.

[11] Patent Number: 5,519,292

[45] Date of Patent: May 21, 1996

[54] FINGERTIP MASSAGER

[75] Inventors: Charles Taylor, San Rafael, Calif.; Blaine Smith, Lincoln City, Oreg.

[73] Assignee: The Sharper Image, San Francisco, Calif.

[21] Appl. No.: 255,383

[22] Filed: Jun. 8, 1994

[51] Int. Cl.⁶ .................................................. A61H 1/00
[52] U.S. Cl. ........................ 318/114; 318/129; 601/80
[58] Field of Search ..................... 318/114, 119, 318/126, 129, 134; 601/46, 48, 53, 66, 70, 72, 78, 80; 607/115, 145, 149, 150

[56] References Cited

U.S. PATENT DOCUMENTS

| | | |
|---|---|---|
| D. 311,955 | 11/1990 | Lie . |
| 1,498,680 | 6/1924 | Clement et al. . |
| 2,181,282 | 11/1939 | Oster ................................... 128/36 |
| 2,644,446 | 7/1953 | Viniegra ............................... 128/41 |
| 2,918,055 | 12/1959 | Boerger ................................ 128/41 |
| 3,149,629 | 9/1964 | Katz .................................... 128/44 |
| 3,623,481 | 11/1971 | Curran .................................. 128/36 |
| 3,841,321 | 10/1974 | Albach et al. . |
| 4,149,530 | 4/1979 | Gow . |
| 4,550,358 | 10/1985 | Crowley et al. . |
| 4,577,626 | 3/1986 | Marukawa et al. . |
| 4,732,142 | 3/1988 | Hurlburt et al. . |
| 4,825,853 | 5/1989 | Iwamoto et al. . |
| 5,070,862 | 12/1991 | Berlant ............................... 128/24.5 |

Primary Examiner—Bentsu Ro
Attorney, Agent, or Firm—Flehr, Hohbach, Test, Albritton & Herbert

[57] ABSTRACT

A fingertip massager transmits a pulsating action through the fingertips of the user to an area being massaged. Vibrating pulsators are attached to the user's fingers for vibrating same. A controller attached to the user's wrist controls the vibration of the vibrating pulsators, including the vibration rate. Flexible connection tubes connect the controller and the vibrating pulsators. The pulsating circuit includes variable square wave circuitry for producing dual alternating voltage outputs and pulsating circuitry for producing a vibrating motion.

6 Claims, 3 Drawing Sheets

FINGERTIP MASSAGER

BACKGROUND OF THE INVENTION

1. Field of the Invention

The present invention relates generally to pulsating massagers and, more particularly, to pulsating massagers which transmit the pulsating action through the fingertips of the user to the area being massaged.

2. Description of the Background

Pulsating electric massagers are known which involve the application of a pulsating device directly to the area being massaged. For example, electric massagers have been sold with a tapered point to focus vibrating action on one point of the area being massaged or with a wide-area head containing tapper heads which move up and down to communicate vibrating action to a large area of skin being massaged. The known pulsating electric massagers have the disadvantage of not permitting the combination of skin-on-skin contact of a professional masseur with vibrations sent below the skin of the area being massaged through the user's fingertips so that the user may press deep into kinks under the skin while the pulsating effect is transmitted to the area being massaged for maximum effect.

In view of this disadvantage, it has been appreciated that it is desirable to combine the skin-on-skin contact of a professional masseur with the pulsating power of electric massagers. To this end, several pulsating electric massagers have been proposed.

U.S. Pat. No. 1,498,680 (Clement et al.) proposes a massage apparatus to be attached to the backs of the hands of the user. The massage apparatus communicates fine vibrations which are regulatable in intensity and amplitude. Clement et al. show the use of vibrators connected to metallic plates which are held firmly to the back of the operator's hands with harnesses. The front edges of the plates rest upon and are located to the rear of the knuckles of the hands. The massage apparatus disclosed by Clement et al. vibrates the entire hand of the user.

U.S. Pat. Nos. 2,181,282 (Oster) and 3,623,481 (Curran) propose vibrating devices which vibrate the rear portion of the user's finger behind the second knuckle. Oster discloses a vibrator for which the amplitude of the vibrations produced may be varied and which attaches to the back of the user's hand as well as around the rear portion of the user's middle two fingers. Oster's patent notes that it is essential that the machine be held in a position with the band in back of the second knuckles of the middle two fingers so that all of the fingers are free for massaging manipulation. Curran shows a gum massage implement to be attached to a single massaging finger. A vibration-generating unit is attached directly to a single finger of the operator rearwardly of the second joint of the finger. Thus, Oster and Curran disclose vibrating devices which vibrate the user's finger only at a rear portion, not at the fingertips.

U.S. Pat. No. 2,918,055 (Boerger) proposes a hand massager which is placed on the back of the user's fingers to vibrate same. The body of the vibrator is attached to the hands of the operator by finger loops which fit around the rear portion of the fingers above the second knuckle. Thus, Boerger shows a hand massager which vibrates the user's fingers at the rear portion of the fingers, not the fingertips. Further, Boerger does not disclose a vibrating hand massager for which the vibration rate may be varied.

None of the above proposed devices are capable of transmitting the pulsating action of an pulsating electric massager through the user's fingertips to the area being massaged and also provide for variability of the vibration rate of the pulsating massager in a simple manner.

SUMMARY OF THE INVENTION

It is an object of the present invention to overcome the deficiencies of the known pulsating electric massagers by providing a pulsating massager that is worn on the user's hand and transmits the pulsating action through the user's fingertips to the area being massaged.

It is another object of the present invention to provide variability of the vibration rate of a pulsating massager in a simple manner, since the vibration of fingertip pulsators combined with pressure of the fingertips can relieve tension and relax sore muscles.

It is a further object of the present invention to provide a pulsating massager for which the user may adjust the pulse frequency as well as the pulse width.

It is a further object of the present invention to provide a pulsating massager which may be easily attached to the fingers and arm of the user and may be operated in a simple manner.

It is a further object of the present invention to provide a pulsating massager that is lightweight and constructed in a simple manner.

It is a further object of the present invention to provide a pulsating circuit for a fingertip massager which has a simple square wave oscillator for its source.

The pulsating massager of the invention is attached to the fingers of the user so that the fingers are free to deeply massage the skin of the area being massaged while the user's fingers are vibrated at the fingertips. Fingertip pulsators are attached to a controller with lightweight flexible connection tubes.

A pulsating circuit controls the functions of the pulsating massager.

The above and other objects, features and advantages of the present invention will become apparent from the following detailed description of the preferred embodiments when read in conjunction with the accompanying drawings.

DETAILED DESCRIPTION OF THE PREFERRED EMBODIMENT

Figure 1:
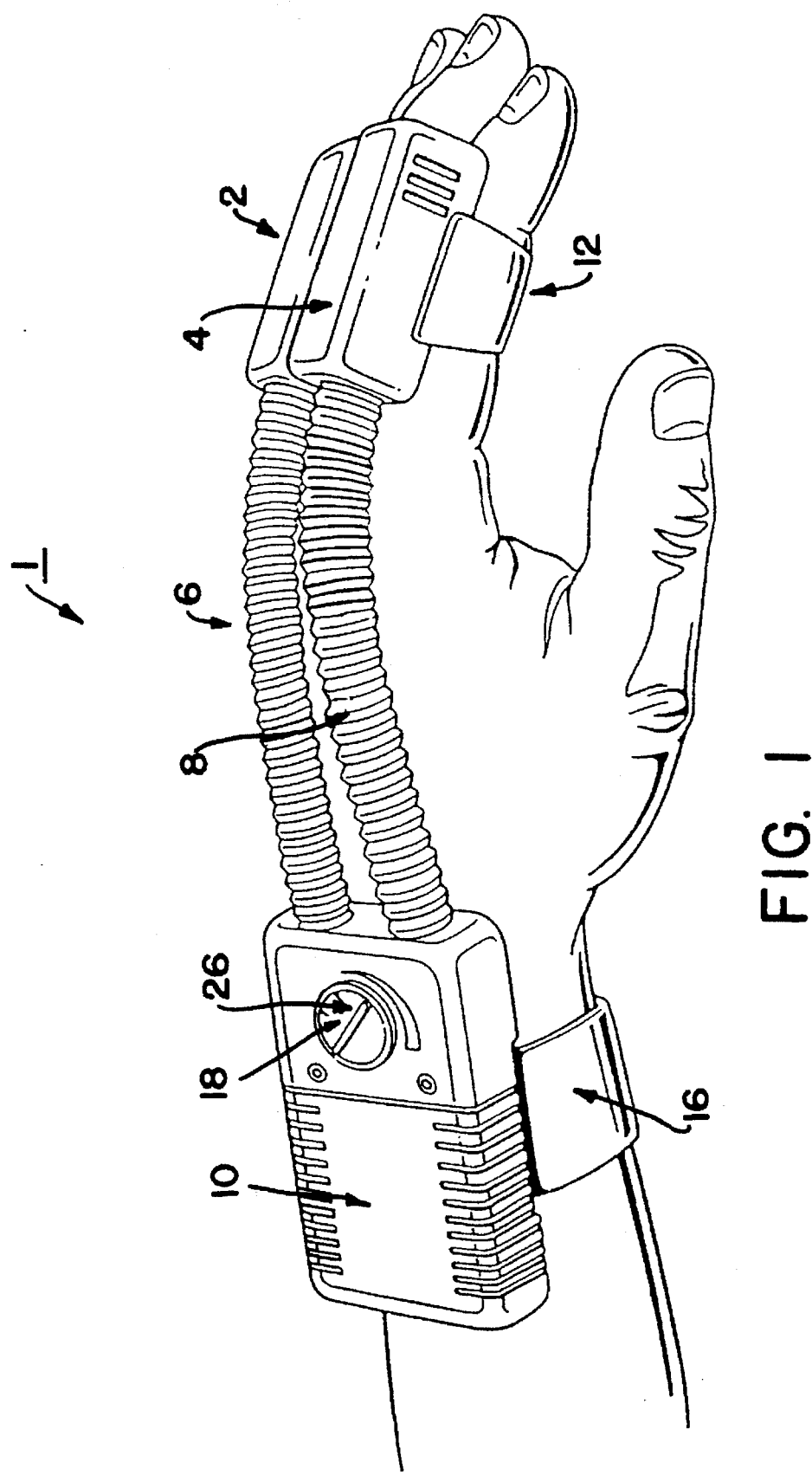
FIG. 1 is a perspective view of a fingertip massager according to the present invention.

With reference to the drawings, and particularly FIG. 1, a fingertip massager 1 according to the present invention includes vibrating pulsators 2, 4 attached to the user's fingers, a controller 10 attached to the user's wrist and connection tubes 6, 8 connecting the vibrating pulsators 2, 4 and the controller 10. The massager 1 may be made of a high impact plastic for strength and durability.

The massager 1 is positioned on the wrist and fingers of the user before the device is turned on. The massager can be worn on either hand. The massager is designed so that it may be comfortably worn on the user's fingers and wrist while a massage is being given. The controller 10 is fastened to the user's wrist with an attachment band 16. In a preferred embodiment of the present invention, the attachment band 16 consists of a strap with a Velcro connector. The controller 10 also contains the power source, i.e. a battery, and circuitry which controls the vibration of the vibrating pulsators 2, 4. Since the controller 10 is attached to the user's wrist, the heavy components of the massager are located away from the fingers and hand so that the fingers may be manipulated to the maximum extent possible for giving a massage.

The vibrating pulsators 2, 4 are designed to vibrate the fingertips of the user. The vibrating pulsators are attached to two fingers of the user. For example, the vibrating pulsators may be placed on the index and middle fingers of the left hand of the user. The vibrating pulsators have finger attachment clips 12 for securing the vibrating pulsators to the ends of the user's fingers. In a preferred embodiment, the finger attachment clips define spaces into which the user's fingers are placed. The finger attachment clips may be adjusted to insure a secure fit for small fingers by the insertion of a spacer into the space of a finger clip into which a user's finger is placed.

The vibrating pulsators 2, 4 contain oscillating motors. The motion of the oscillating motors causes the user's fingers near the fingertips to vibrate when the pulsating massager is in use. The pulsing alternates between the two vibrating pulsators. Thus, the user's fingertips vibrate in a comfortable manner while a massage is being given.

It is desirable that the massager move and flex with the movements of the user's hand while a massage is being given. Therefore, flexible connector tubes 6, 8 connect the vibrating pulsators 2, 4 to the controller 10 over the top of the user's hand. In a preferred embodiment, the connector tubes 6, 8 are constructed of flexible plastic tubing. The flexible connector tubes 6, 8 move and flex as the user maneuvers his fingers while giving a massage.

It is desirable that the user be able to set the vibration rate of the vibrating pulsators 2, 4 to a comfortable level. The vibration rate of the vibrating pulsators 2, 4 in the present invention may be varied. The user adjusts the vibration rate with a rheostat 18 which is capable of controlling the vibration rate of the vibrating pulsators. In a preferred embodiment, the vibration rate is varied by turning a rotatable knob 26 on the controller 10. The oscillation rate may be set at any desired value. In a preferred embodiment, the oscillation rate range of the oscillating motors is about 1 per second to 10 per second. The rotatable knob allows for varying the oscillation rate to permit a variation in massage vibration intensity from gentle to strong.

Figure 2:
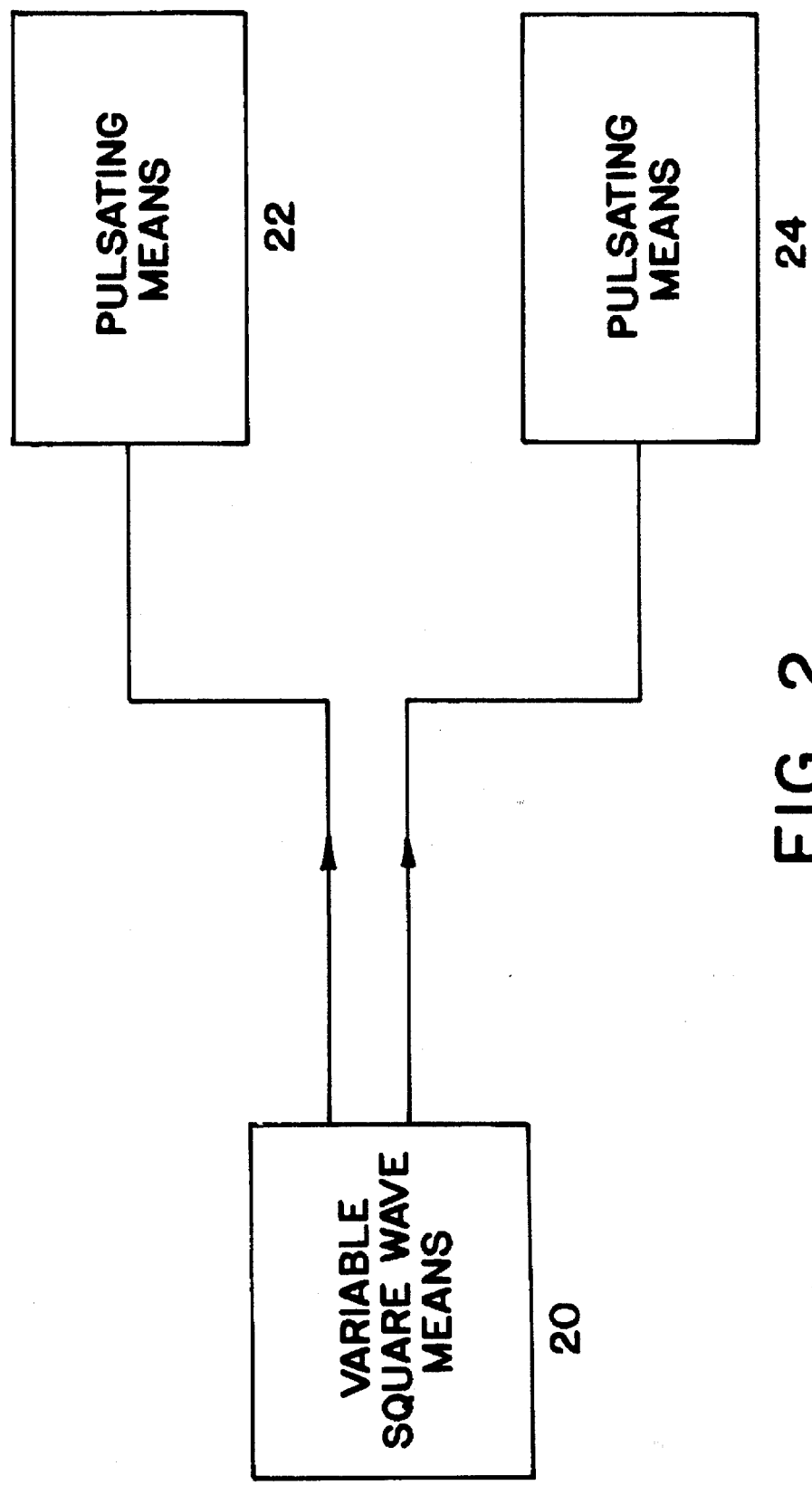
FIG. 2 is a block diagram of the pulsating circuit of the present invention.

As depicted in FIG. 2, the pulsating circuit comprises a variable square wave means 20 for producing dual alternating voltage outputs and pulsating means 22, 24 driven by the variable square wave means for producing a vibrating motion. The variable square wave means 20 turns the pulsating means 22, 24 on and off alternately and at a variable rate.

Figure 3:
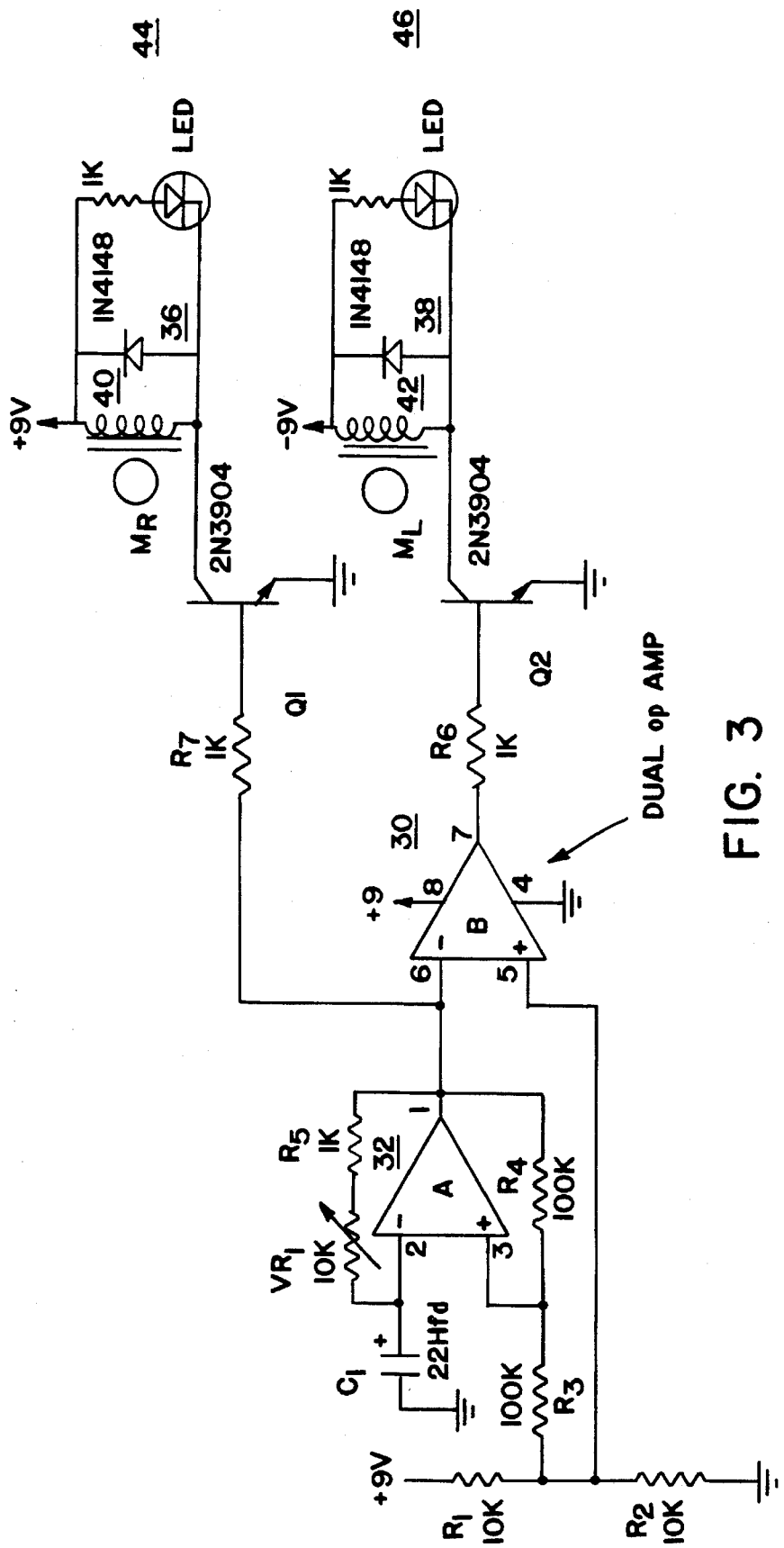
FIG. 3 is a circuit diagram of the pulsating circuit of the present invention.

The massager of the present invention has a simple square wave oscillator for its source. A preferred embodiment of the pulsating circuit is illustrated in greater detail in FIG. 3. The variable square wave means 20 consists of a dual operational amplifier (op amp) 30, 32. The op amp 32 must be able to switch to ground. The op amp 32 is a square wave oscillator with a 50% duty cycle in which circuit components, including a potentiometer VR1, control the frequency of the square wave voltage output. The ratio of resistors R1 and R2 set the duty cycle, which is 50% if the op amp 32 is switching close to the power rails. The arrangement of the potentiometer VR1 and the resistor R5 and the capacitor C1 control the oscillating frequency of the op amp 32. The capacitor C1 is the timing cap and should have a maximum 20% tolerance.

The frequency of the square wave output of op amp 32 varies as the potentiometer VR1 is adjusted. The potentiometer VR1 may be a component of the rotatable knob 26. The value of the potentiometer VR1 may be chosen to match the sliders in the rotatable knob 26 for ease of procurement. Adjustment of the potentiometer VR1 varies the frequency of the oscillation by changing the RC time.

The op amp 30 inverts the square wave output from op amp 32. Each of the dual alternating voltage outputs are fed into the base of a transistor Q1, Q2, the emitter of which is connected to ground and the collector of which is connected to the pulsating circuitry 22, 24. The drive to the transistors Q1, Q2 is somewhat limited by the resistors R6, R7, which reduce the power to the 6 volt motors 40, 42 running on 9 volts. The values of the resistors R6, R7 may be reduced if more power is desired.

The pulsating circuitry 22, 24 consists of a motor 40, 42 and a diode 36, 38 connected in parallel. The output of op amp 32 turns on and or off transistor Q1, which pulses the motor R 40 on and off at the set rate of op am 32. The output of op amp 30 turns on and off transistor Q2 which pulses the motor L 42 on and off at the set rate of op amp 32, but opposite that of motor R 40. When motor R 40 is turned on, motor L 42 is turned off, and when motor L 42 is turned on, motor R 40 is turned off. The diodes 36, 38 are used as catch diodes to prevent reverse inductive spikes from destroying the transistors Q1, Q2.

A series combination of a resistor and a light emitting diode 44, 46 may be placed in parallel with the oscillating motor 40, 42 and the diode 36, 38, whereby each light emitting diode is illuminated when the respective motor 40, 42 to which it is connected in parallel is operating. The light emitting diodes indicate that the motor 40, 42 is functioning.

An additional circuit may be included in the present invention for adjusting the pulse width of the vibrations of the vibrating pulsators. Thus, the user would have the ability to adjust both the pulse width and the pulse frequency of the vibrating massagers. The use of such an additional circuit would be advantageous because the massager would use less power and the user would have greater control over the vibrations of the vibrating pulsators.

Any variations or modifications of the present invention envisioned by one of ordinary skill in the art are contemplated to be within the scope of this invention.

We claim:

1. A pulsating circuit for a fingertip massager comprising:
   variable square wave means for producing dual alternating voltage outputs;
   pulsating means driven by said variable square wave means for producing a vibrating motion alternately in different fingertips.

2. The pulsating circuit according to claim 1 wherein said variable square wave means comprises a dual operational amplifier.

3. The pulsating circuit according to claim 2 wherein said variable square wave means further comprises a potentiometer.

4. The pulsating circuit according to claim 1 wherein said pulsating means comprises an oscillating motor.

5. The pulsating circuit according to claim 4 wherein said pulsating means further comprises a light emitting diode.

6. The pulsating circuit according to claim 1 further comprising pulse width variation means for adjusting the width of said dual alternating voltage outputs.

* * * * *